United States Patent [19]

Tanaka et al.

[11] Patent Number: 5,280,454
[45] Date of Patent: Jan. 18, 1994

[54] ELECTRICALLY ERASABLE PROGRAMMABLE READ-ONLY MEMORY WITH BLOCK-ERASE FUNCTION

[75] Inventors: Tomoharu Tanaka; Yoshihisa Iwata, both of Yokohama; Koji Sakui, Tokyo; Masaki Momodomi, Yokohama, all of Japan

[73] Assignee: Kabushiki Kaisha Toshiba, Kawasaki, Japan

[21] Appl. No.: 764,213

[22] Filed: Sep. 23, 1991

[30] Foreign Application Priority Data

Nov. 21, 1990 [JP] Japan .................................. 2-318397

[51] Int. Cl.$^5$ ............................................. G11C 16/02
[52] U.S. Cl. ................................... 365/218; 365/185; 365/230.03
[58] Field of Search ................. 365/218, 185, 230.03, 365/900

[56] References Cited

U.S. PATENT DOCUMENTS

| 4,939,690 | 7/1990 | Momodomi et al. | 365/185 |
|---|---|---|---|
| 4,996,669 | 2/1991 | Endoh et al. | 365/185 |
| 5,008,856 | 4/1991 | Iwahashi | 365/185 |
| 5,034,926 | 7/1991 | Taura et al. | 365/218 |
| 5,065,364 | 11/1991 | Atwood et al. | 365/185 |

FOREIGN PATENT DOCUMENTS

| 0254750 | 2/1988 | European Pat. Off. | |
| 0447856 | 9/1991 | European Pat. Off. | 365/900 |
| 1173654 | 7/1989 | Japan . | |

OTHER PUBLICATIONS

IEEE Journal of Solid-State Circuits, vol. 24, No. 5, pp. 1259-1264, Oct. 1989, V. N. Kynett, et al., "A 90-ns one-million erase/program cycle 1-Mbit flash memory".

Elektronik, vol. 2, pp. 105-107, Jan. 20, 1989, M. Schmötzer.

T. Tamaka et al, "A 4-Mbit NAND-EEPROM with Tight Programmed Vt Distribution", 1990 Symposium on VLSI Circuits Digest of Technical Papers, pp. 105-106, Jun. 1990.

Primary Examiner—Eugene R. LaRoche
Assistant Examiner—Son Dinh
Attorney, Agent, or Firm—Oblon, Spivak, McClelland, Maier & Neustadt

[57] ABSTRACT

An EEPROM includes an array of memory cells divided into a plurality of memory blocks in a semiconductor well region in a substrate. Each block includes series arrays of FATMOS transistors each acting as one memory cell, wherein binary information may be stored in a selected cell transistor by causing carriers to tunnel between the floating gate thereof and the well region. In each block, word lines are connected to the control gates of cell transistors; control lines are to select transistors provided in the series arrays of cell transistors, with which bit lines are associated. A block-erase operation is performed such that a desired one of the memory blocks is selected for erase, while forcing the remaining memory blocks to remain non-erased. To do this, a first voltage is applied to those of the word lines of the selected block, while applying a second voltage to the remaining word lines of the non-selected blocks, the control lines of all the blocks, and the well region.

37 Claims, 9 Drawing Sheets

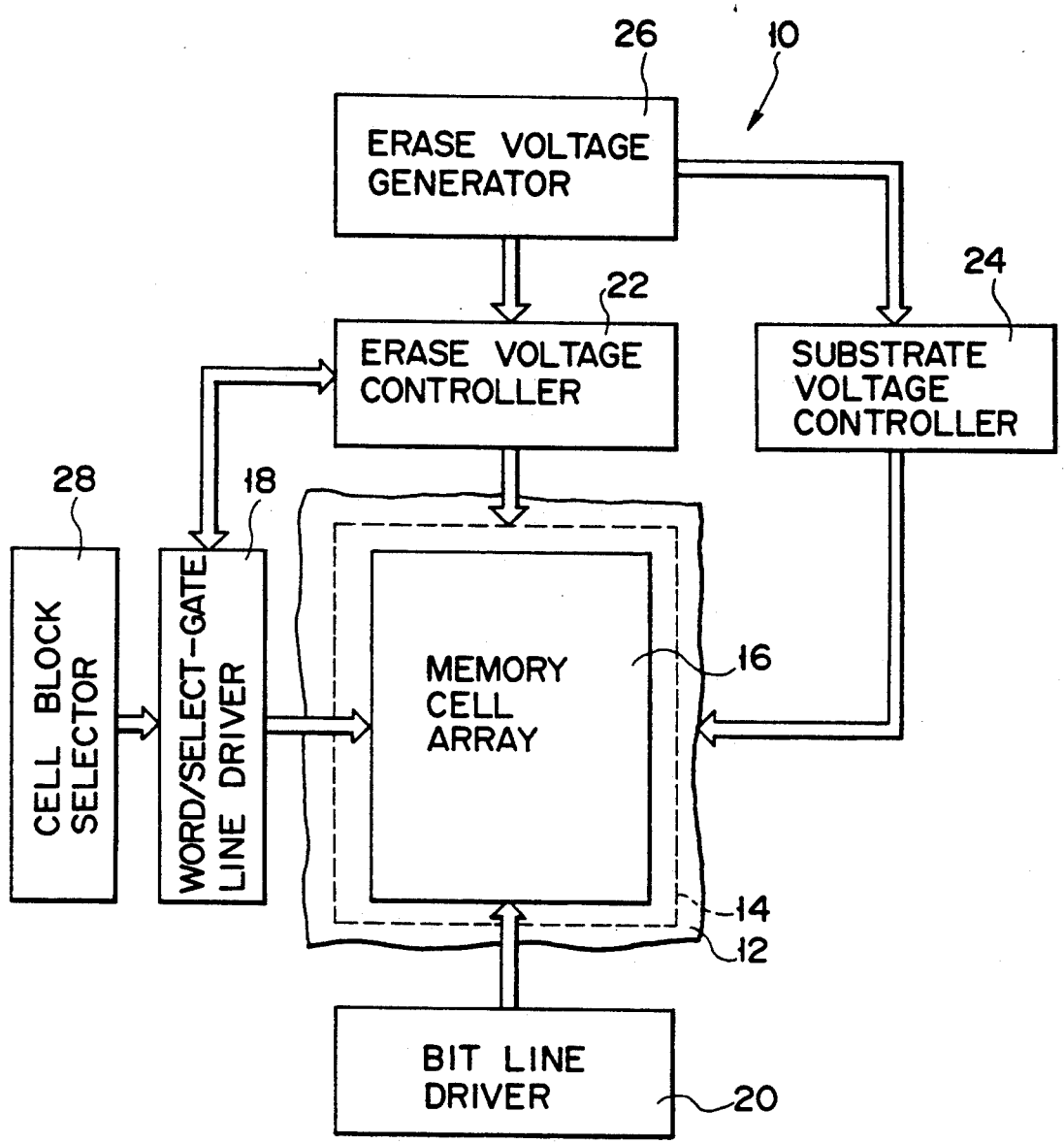
F I G. 1

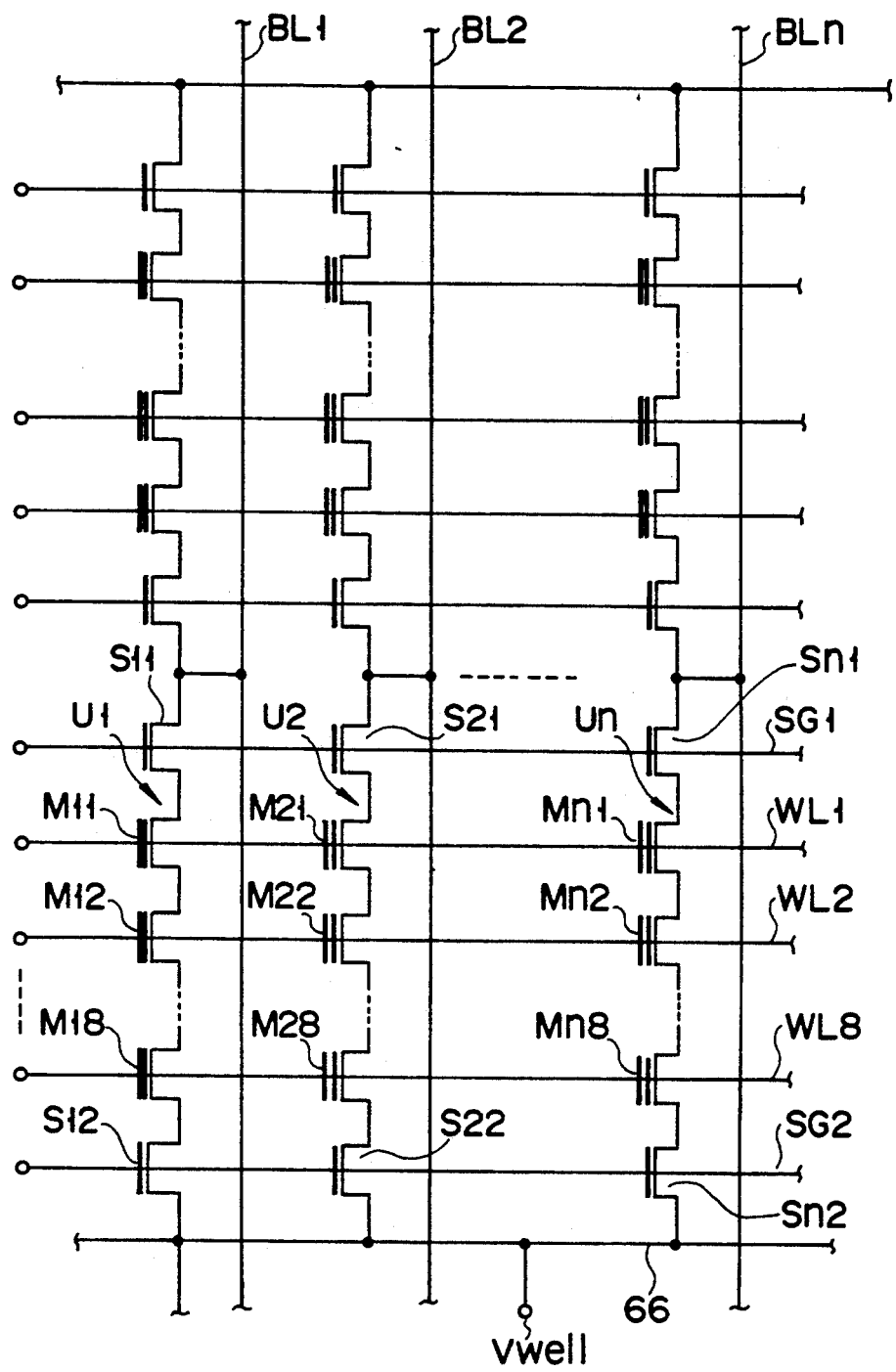
F I G. 2

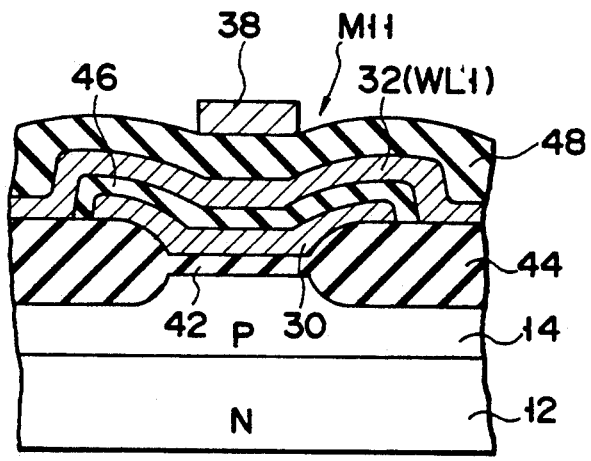
F I G. 4
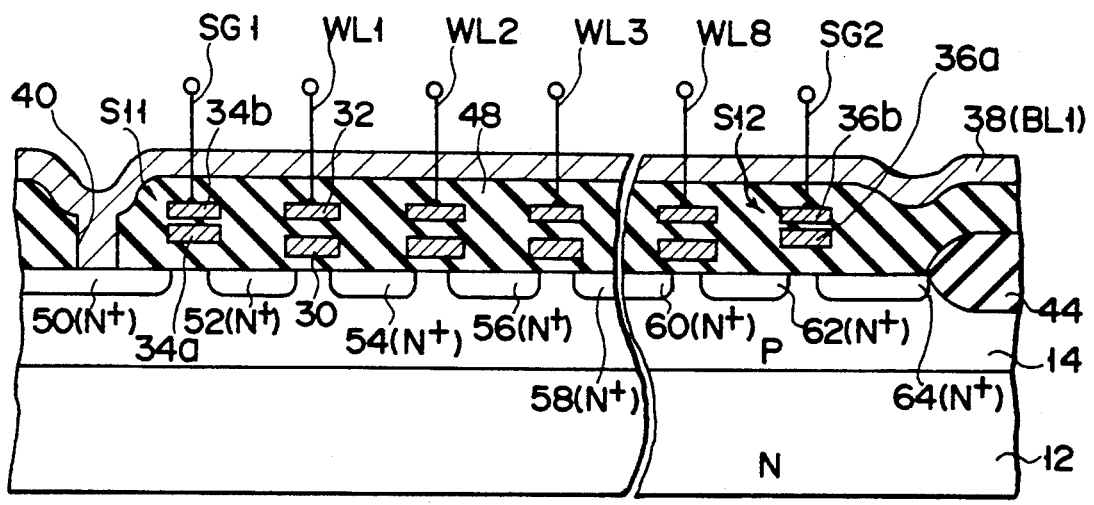
F I G. 5

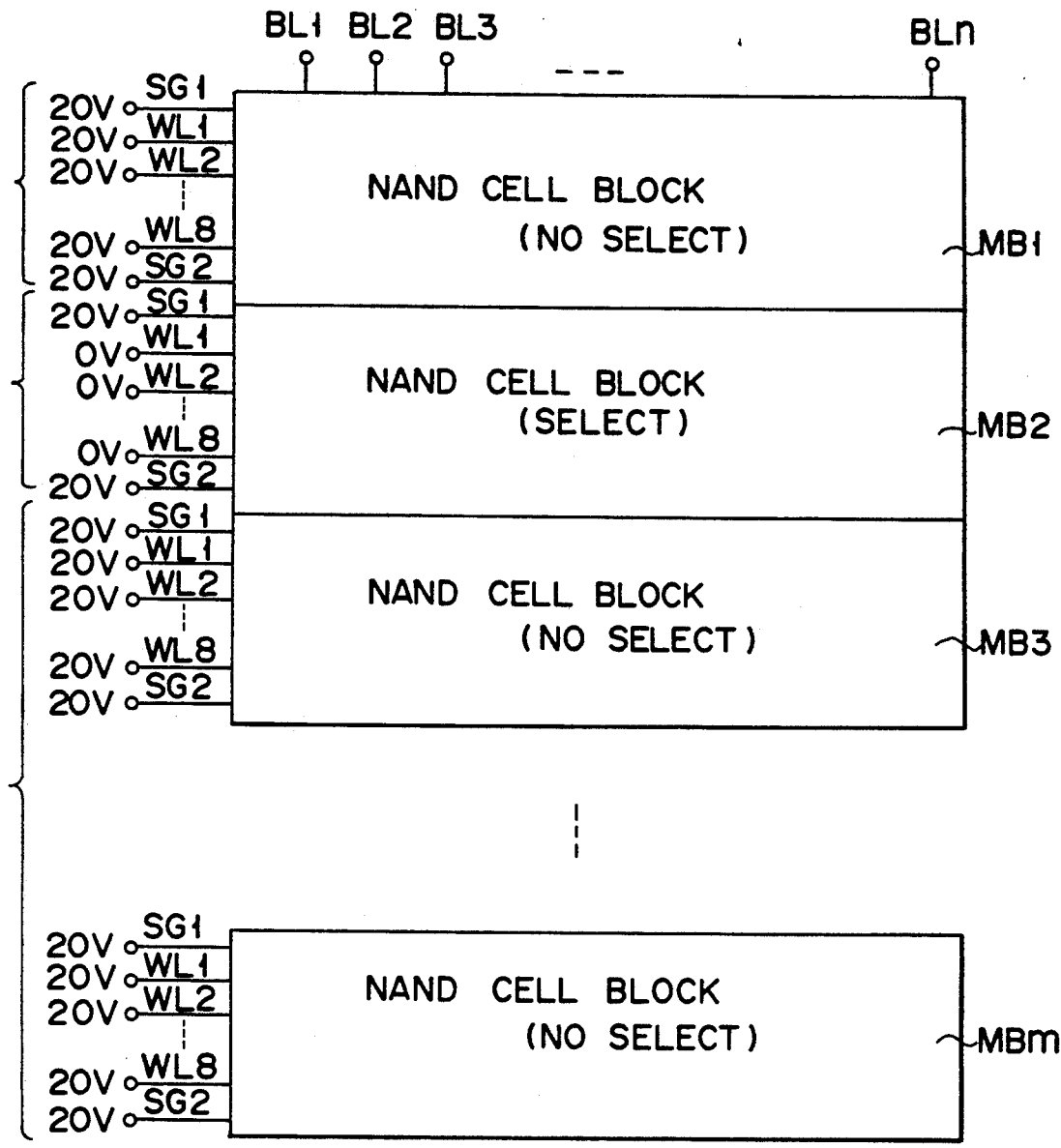
F I G. 6

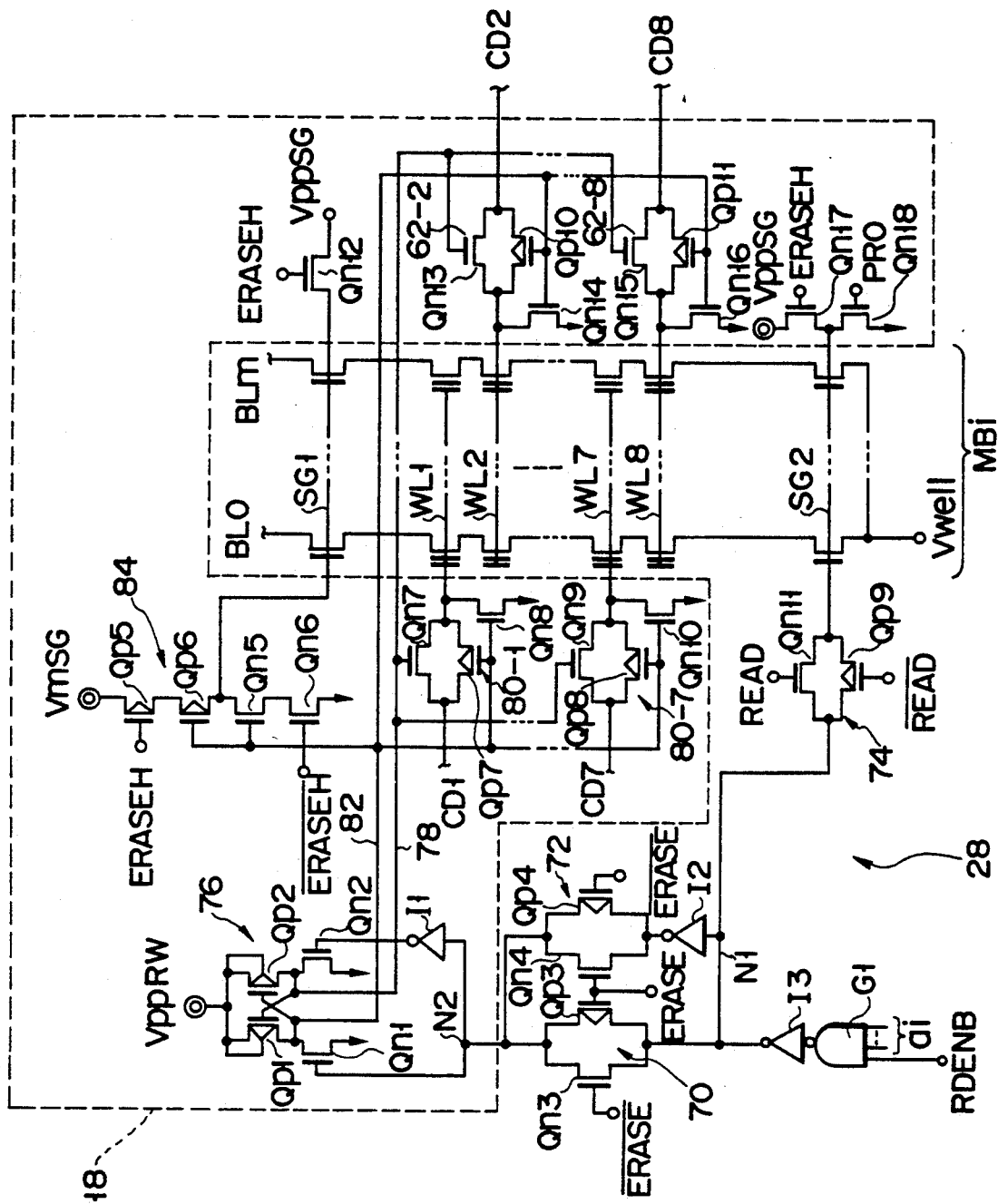
F I G. 7

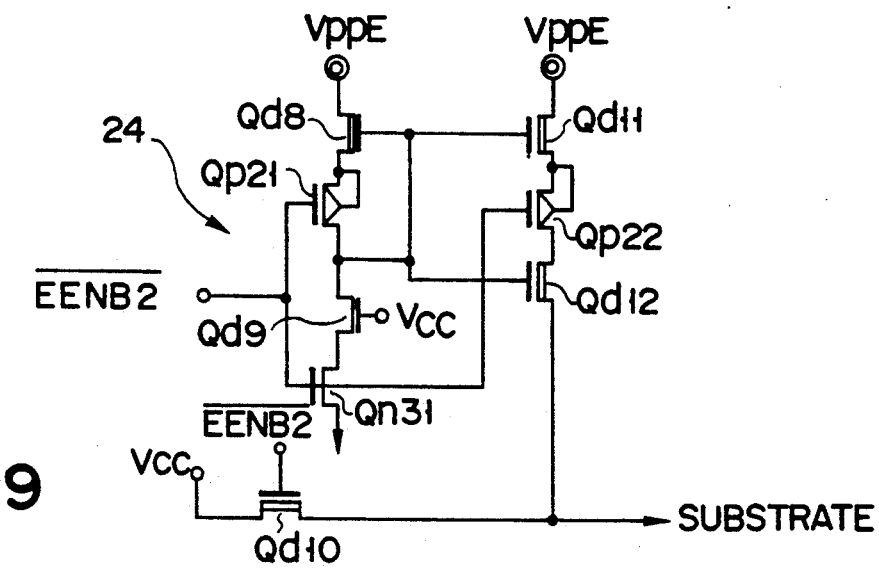
F I G. 9
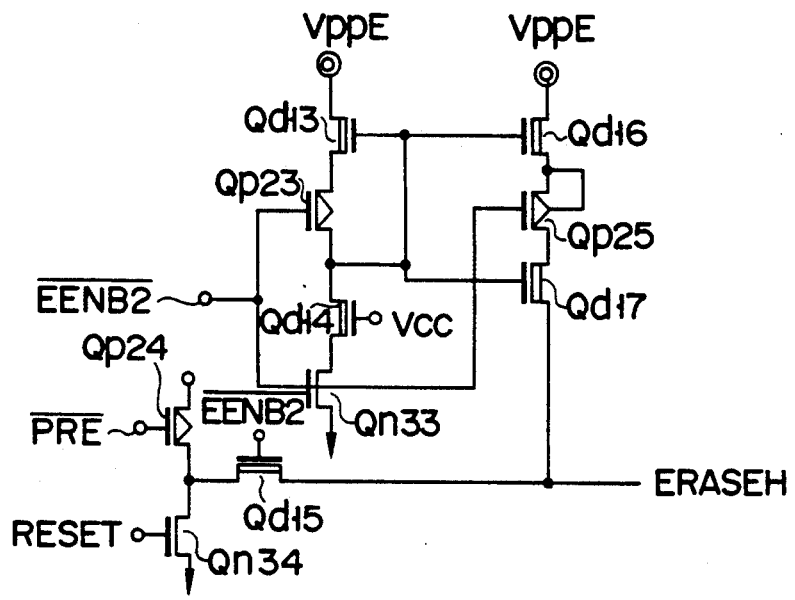
F I G. 10
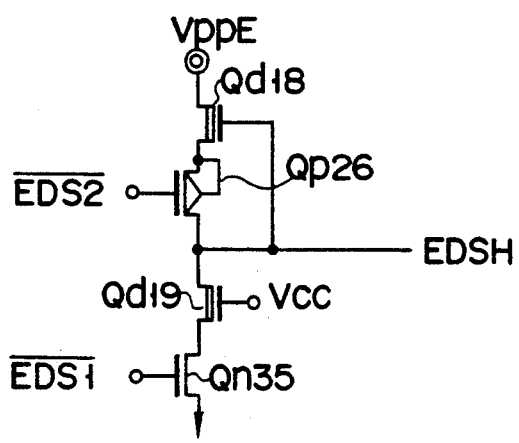
F I G. 11

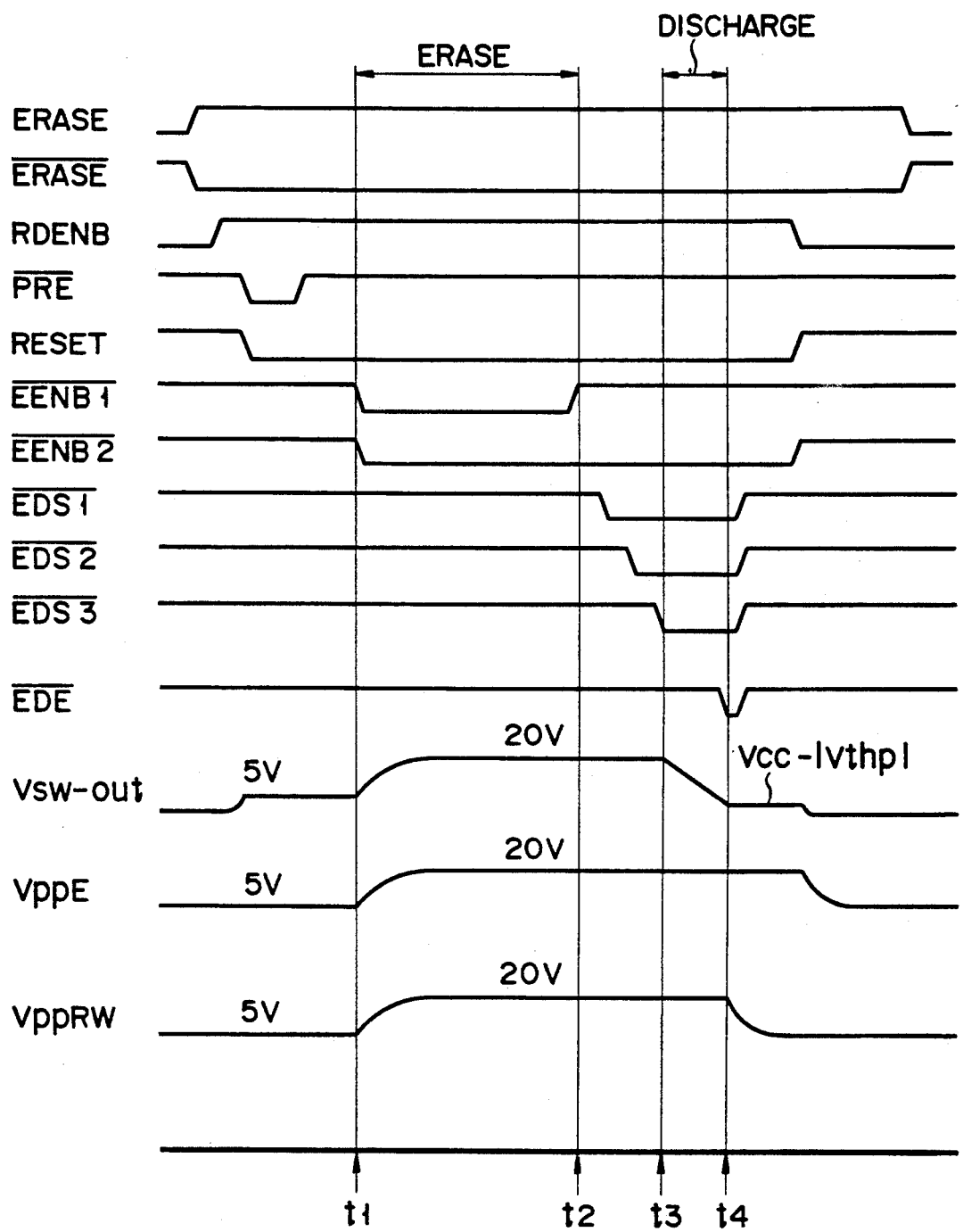
F I G. 12

ELECTRICALLY ERASABLE PROGRAMMABLE READ-ONLY MEMORY WITH BLOCK-ERASE FUNCTION

BACKGROUND OF THE INVENTION

Field of the Invention

This invention relates to semiconductor memory devices, and more particularly to non-volatile memory devices that are programmable and may be electrically erased by the user. The invention also relates to electrically erasable programmable read-only memory devices having an array of memory cells each of which includes one floating gate tunneling field effect transistor.

Description of the Related Art

With the increasing needs for high performance and reliability of digital computer systems, further development of a large-capacity semiconductor memory has been demanded strongly. To meet such requirements, specific electrically erasable and programmable read-only memories (EEPROMs) have been developed recently, which increase the cell-packing density by decreasing the number of transistors required for each memory cell on a chip substrate of limited size.

A very recent development has been directed to a specific type of EEPROM, typically known as the "NAND type EEPROM," which does not require the use of any extra transistor as a switching gate for each memory cell and thus can exhibit a dramatic density improvement. With this EEPROM, a plurality of series circuits of floating gate tunneling metal oxide semiconductor (FATMOS) field effect transistors are arranged so that each series transistor circuit is connected via one switching transistor to a corresponding one of data transfer lines. The data transfer lines may be called the "bit lines." When the switching transistor is rendered conductive, the series circuit of FATMOS transistors associated therewith is connected selectively to the corresponding bit line. In this sense, the switching transistor is ordinarily called a "select transistor" among those skilled in the art.

Each of the series-connected FATMOS transistors serves as a minimum element for digital data storage, which may correspond to one "memory cell" in conventional dynamic random access memories or DRAMs. (In some cases, one series circuit of FATMOS transistors will be called the "memory cell." Such terminology itself is not so important. In this patent specification, each series transistor circuit will be named as a "NAND cell unit.") Generally, each series circuit includes four, eight or sixteen FATMOS transistors. Each transistor has a control gate connected to a corresponding word line and a floating gate for capacitively storing carriers indicative of a logic "1" or "0." Since each memory cell can be formed of one transistor, the integration density of the EEPROM can be increased to improve the storage capacity thereof.

With the currently available NAND type EEPROM, data is sequentially written into the FATMOS transistors—i.e., memory cell transistors—in each NAND cell unit. Writing or "programming" a logic data in the EEPROM at a desired memory address, that is, into a selected cell transistor in a designated NAND cell unit, may be performed using a high-level voltage Vpp and an intermediate voltage Vppm. Typically, voltage Vpp is a 20-volt voltage; voltage Vppm is potentially intermediate between the power supply voltage Vcc and high voltage Vpp, and is typically 10 volts when power supply voltage Vcc is 5 volts. While high voltage Vpp is applied to the control gate of the selected cell transistor intermediate voltage Vppm is applied to the control gates of non-selected cell transistors lying between the selected cell transistor and the select transistor.

When a voltage representing a logic "1" data (typically, a zero-volt voltage) is given to a selected bit line, this voltage is transferred to a target memory cell—more specifically, the drain layer of a selected cell transistor—through the nonselected memory cell transistors that remain conductive. A high electric field is thus created in a gate insulation layer between the floating gate and the drain of the selected cell transistor. This causes electrical carriers (electrons) to tunnel from the substrate (drain) to the target floating gate. The threshold value (threshold voltage) of this cell transistor shifts positively. The logic "1" is stored or "programmed" in the selected cell transistor at the desired memory address. When the intermediate voltage Vppm is applied as a voltage indicative of a logic "0" to the bit line, the injection of electrons does not occur in the selected cell transistor. The threshold voltage of it is thus kept unchanged. This state is defined as the logic "0" storing state.

Conventionally, the NAND memory cell transistors are simultaneously erased with the entire section of the memory cell array as a unit. This is a so-called "simultaneous erase" operation. During erasing, all the NAND cell units are electrically disconnected from the bit lines. The control gates of all the memory cell transistors are kept at 0 volts, and the substrate voltage (the well potential if the NAND cell units are formed in a well region) is at the high-level voltage Vpp. With such a voltage application, electrons move to the substrate (or the well region) from the floating gate electrodes of all of the cell transistors; the threshold voltage thereof shift negatively. All the data bits stored are thus electrically erased at a time.

One major problem with the conventional NAND type EEPROMs is that it is very difficult to perform a "partial erase" or "block erase" function wherein only a designated part of the memory cell array is erased without any accidental erasure for non-selected cell transistors. The excutable erase function is restricted to the simultaneous erase only; therefore, even if one memory cell unit is to be subjected to rewriting or "reprogramming," all of the memory cell units including non-selected cell units must be erased before the partial reprogramming. Such inconvenience degrades the efficiency of partial erase operation; more seriously, it has been a bar to wide applicability of the NAND type EEPROMs in the digital computer technology, thus unabling the users to take out full advantages therefrom.

SUMMARY OF THE INVENTION

It is therefore an object of the present invention to provide a new and improved non-volatile semiconductor memory device capable of performing a partial or selective erase operation with respect to a specified group of memory cells.

In accordance with the above object, the invention is directed to a specific electrically erasable non-volatile semiconductor memory device which includes an array of rows and columns of memory cells divided into a plurality of groups, called the "memory cell blocs." Each memory cell includes one transistor with a carrier storage layer and a control gate. In each memory cell block, program lines are associated with the rows of memory cells, whereas data transfer lines are with the columns of memory cells. Any desired block may be selected for erasure from among the memory cell blocks, with the remaining ones of these blocks being kept unchanged in the data storage condition thereof. To do this, a voltage application system is provided for selectively applying a suitable potential to the control gates of memory cell transistors in the selected memory block so that carriers are permitted to move to or from the carrier storage layers thereof, while causing an internal electric field of the memory cell transistors in the remaining non-selected memory blocks to be weak enough to prevent movement of carriers therein.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 1 is a circuit diagram showing an overall arrangement of a block-erase type NAND cell EEPROM in accordance with one preferred embodiment of the present invention.

FIG. 2 is a circuit diagram showing the main section of an array of memory cell transistors arranged in rows and columns to define a plurality of NAND cell units of the EEPROM shown in FIG. 1.

FIGS. 4 and 5 are cross-sectional views of the NAND cell unit shown FIG. 2 along lines IV—IV, V—V, respectively.

FIG. 6 is a diagram showing the array of memory cells of FIG. 1, which is divided into a preselected number of memory cell blocks each of which includes NAND cell units similar to those of FIG. 2.

FIG. 7 is a circuit diagram showing a cell block selector circuit and a driver circuit of FIG. 1 which is associated with each of the memory cell blocks shown in FIG. 6.

FIG. 9 is a circuit diagram of a substrate voltage controller circuit shown in FIG. 1.

FIG. 10 is a circuit diagram of an erase control signal generator employed in the circuit of FIG. 7.

FIG. 11 is a circuit diagram of a gate control signal generator employed in the circuit of FIG. 8.

FIG. 12 is an illustration of a timing diagram showing the pulse sequence for the block-erase operation of the embodiment of the present invention.

DETAILED DESCRIPTION OF THE PREFERRED EMBODIMENTS

Figure 3:
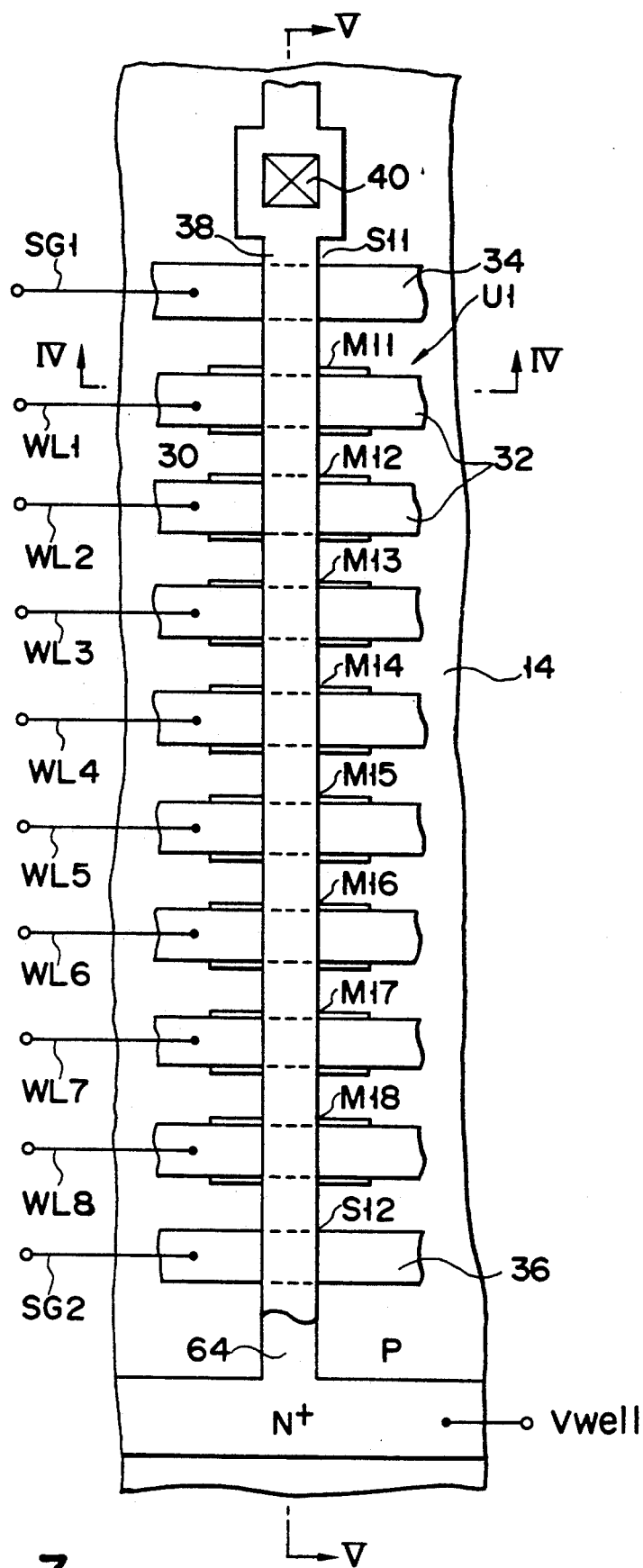
FIG. 3 is a plan view of a certain one of the NAND cell units of FIG. 2, wherein intermediate insulation layers are omitted for purposes of illustration.

Referring to FIG. 1 a NAND cell type electrically erasable and programmable read-only memory (EEPROM) device in accordance with one preferred embodiment of the present invention is generally designated by numeral "10." The EEPROM 10 has a silicon substrate 12 of a preselected type of conductivity—typically, N type. Substrate 12 has a semiconductive well region 14 of the opposite conductivity type, i.e., P type, in the top surface section thereof, in which an array of memory cells 16 are arranged as will be explained later.

As shown in FIG. 1 the memory cell array 16 is associated with two driver circuits 18 and 20. Driver circuit 18 is the circuit which controls the voltages on parallel program lines and select gate lines arranged in memory cell array 16. Detailed arrangement of these lines will be discussed laser. Driver circuit 20 is the circuit to control the voltages on parallel data transfer lines arranged in the memory cell array. The data transfer lines will be referred to as the "bit lines," while the program lines as the "word lines" in the rest of the description.

A voltage control circuit 22 labeled "erase voltage controller" in FIG. 1 is connected to the well region 14, for controlling the voltage potential at well region 14 in a partial erase mode, called "block-erase" mode. Circuit 22 is also connected to the word/select-gateline driver circuit 18. A voltage control circuit 24 is connected to substrate 12, for controlling the substrate voltage in the block-erase mode. An erase voltage generator 26 supplies a suitable d.c. voltage to the erase voltage controller 22 and substrate voltage controller 24. A circuit 28 is connected to driver 18, and specifies a desired group selected from the cell array 16. This circuit will be called "cell block selector."

As shown in FIG. 2, each bit line BLi (i=1, 2, ..., n) is associated with series circuits U of floating gate tunneling metal oxide semiconductor (FATMOS) field effect transistors. Each series transistor circuit Ui includes eight FATMOS transistors Mi1, Mi2, ..., Mi8. For example, series circuit U1 includes FATMOS transistors M11, M12, ..., M18 as shown in FIG. 2. Each transistor Mij (i=1, 2, ..., n; j=1, 2, ..., 8) may serve as a "memory cell" for storing a logic data "1" or "0." The series array of every eight memory transistors will be referred to as the "NAND cell unit"; FATMOS transistors M will be called the "memory cell transistors," or more simply the "memory cells." The upper half section of the memory cell matrix of FIG. 2 is arranged similarly.

In each NAND cell unit Ui, memory cell transistors Mi1, Mi2, ..., Mi8 are connected at their control gate electrodes to word lines WL1, Wl2, ..., WL8, respectively. Each of NAND cell units U1, U2, ..., Un is connected to a corresponding one of the bit lines BL via a first insulated-gate metal oxide semiconductor field effect transistor or MOSFET Si1. For example, NAND cell unit U1 is connected via MOSFET S11 to bit line BL1. MOSFET S11 is connected to one control gate line SG1 together with those (S21, ..., Sn1) of the other NAND cell units U2, ..., Un at the control gate electrodes thereof. These MOSFETs S1 are responsive to a voltage signal on control gate line SG1; each MOSFET turns on causing NAND cell unit Ui to be selectively tied to a corresponding bit line BLi associated therewith. The switching MOSFETs S1 will be called the "first select transistors."

From FIG. 2 it is apparent that each of the NAND cell units U1, U2, ..., Un is connected through a second MOSFET Si2 (i=1, 2, ..., n) to a well potential Vwell, which is the potential at well region 14 and is the common source voltage for the memory cell transistors M. In NAND cell unit U1, as one example, the second MOSFET S12 is connected between a source layer of the last stage of cell transistor M18 therein and the common source voltage. The second MOSFET S12 and corresponding ones S22, ..., Sn2 in the other NAND cell units U2, ..., Un are connected together at their control gate electrodes to a second control gate line SG2. MOSFETs S2 perform a switching operation in response to a voltage signal on control gate line SG2; they turn on causing NAND cell units U to be coupled to well voltage Vwell. The switching transistors S2 will be called the "second select transistors."

The planar arrangement of memory cell transistors M11 to M18 in NAND cell unit M11 is shown in FIG. 3, wherein intermediate insulative layers are omitted for purposes of illustration only. Each memory cell transistor has a floating gate electrode 30-i (i=1, 2, ..., 8) insulatively disposed above P-type well region 14 in N-type substrate 12, and a control gate electrode 32-i insulatively stacked on the floating gate. Control gates 32-1, 32-2, 32-3, ..., 32-8 function as word lines WL1, WL2, ..., WL8. Note that, although the underlying floating gates 30 are so illustrated as to be greater in width than control gates 32, this is merely an illustrative deformation; actually, the stacked gate electrodes are substantially the same in width with each other, for example 1 micrometer for the both. The first and second select transistors S11, S12 are arranged at the both ends of array of memory cell transistors M11 to M18. These select transistors have control gate electrodes 34, 36, which will be referred to as the "select gates."

The bit line BL1 in FIG. 3 is comprised of an elongated metallic layer 38, which extends to insulatively cross the control gates 32 and the first and second select gates 34, 36. First select transistor S11 is electrically coupled with the bit line layer 38 at its drain region via a contact-hole section 40 formed in layer 38. Second select transistor S12 is connected at its source to well voltage Vwell serving as the common source voltage.

The cross-sectional view of one memory cell transistor in NAND cell unit U1 is shown in FIG. 4. An insulation thin-film 42 is deposited within the element-formation area defined by an element-separation insulating layer 44 on the top surface of P-type well region 14 in N-type substrate 12. These insulative layers may be thermal-oxide layers. Insulation thin-film 42 is about 11 nanometers in thickness. This thin-film acts as a gate insulation layer. Floating gate electrode 30 is stacked on gate insulation layer 42 such that it is long enough to "ride" on element-separation insulating layer 44, as illustrated in FIG. 4. Floating gate 30 is covered with an insulative layer 46, which is 35 nanometers in thickness. On layer 46 is formed the control gate electrode 32 that is substantially the same in width as floating gate 30. Control gate 32 extends long as it may serve as word line WL1. Floating gate 30 defines capacitance C1 between itself and well region 14; it also defines capacitance C2 between control gate 32 and itself. Capacitance C1 is less than C2. Control gate 32 is covered with an insulative layer 48, on which metal layer 38 (bit line BL1) is formed.

FIG. 5 shows the cross-sectional view of a plurality of heavily-doped N (N+) type semiconductor diffusion layers 50, 52, 54, 56, 58, ..., 60, 62, 64, which are arranged in the top surface portion of P type well region 14 such that they are aligned along bit line BL1 at constant interval therebetween. N+ type layer 50 acts as the drain of first select transistor S11. As apparent from FIG. 5, N+type layer 50 is coupled to metal wiring line 38 via contact-hole section 40. N+ type layer 52 functions as the source of first select transistor S11. N+ type layer 52 also functions as the drain of neighboring memory cell transistor M11. In other words, N+ layer 52 is shared commonly by select transistor S11 and cell transistor M11 neighboring thereto. Similarly, N+ layer 54 may serve as the source and drain of two neighboring memory cell transistors M11, M12. N+ layer 64 is employed as the source of second select transistor S12. N+ layer 64 exhibits its plan view in the reverse-"T"-shape as illustrated in FIG. 3, which constitutes a common source line 66 of FIG. 2.

Note that the gate electrode 34, 36 of each select transistor S11, S12 has a double-layered structure of polycrystalline silicon layers coupled to each other. More specifically, first select gate 34 is comprised of two stacked layers 34a, 34b; second select gate 36 is comprised of two stacked layers 36a, 36b. The gate insulation section of the underlying layers 34a, 36a is greater in thickness than that of memory cell transistors M.

The overall system of the NAND cell array 16 of FIG. 1 is shown in FIG. 6. The NAND cell units U of the cell array 16 are divided into a preselected number of groups: these groups will be referred to as the "NAND memory cell blocks" MB1, MB2, ..., MBm. Each memory cell block MBi (i=1, 2, ..., m) contains a certain number (n) of NAND cell units U1, U2, ..., Un (see FIG. 2). The block-erase technique of the present invention causes memory cell array 16 to be selectively and partially erased with one memory block MBi as a unit.

Basically, the write operation of NAND type EEPROM 10 is similar to that of conventional ones previously described in the introductory part of this specification. EEPROM 10 is unique in its block-erase operation, which will be described below. Note that in the following description the principle of the block-erase operation will be first discussed with reference to FIG. 6, and the practical operations mode(s) will then be explained together with practical internal circuit configurations to be employed in EEPROM 10.

For purposes of explanation, assume that, in the memory blocks MB1 to MBm of FIG. 6, only the second block MB2 is selected for erasure, while the remaining blocks MB1, MB3, ..., MB are unchanged in their data storage condition. In this case, the circuit 26 (see FIG. 1) generates a specific voltage (erase voltage) VppE, which is applied to N type substrate 12 and P type well region 14. Erase voltage VppE may be +20 volts. First and second select gate lines SG1, SG2 of all blocks MB1, MB2, ..., MBm are applied with a voltage that is potentially reverse to compensate for the potential difference between these lines and well region 14. This voltage may be equal in potential to the erase voltage VppE. A 0-volt voltage is applied to select gate electrodes (word lines) WL1 to WL8 associated with the selected block MB2 as shown in FIG. 6.

At this time, the voltage on the word lines associated with non-selected blocks MB1, MB3, ..., MBm is kept at erase voltage VppE. All bit lines BL are thus in an "electrically floating" condition. With such a voltage application, electrical carriers (electrons) stored at the floating gates 30 of memory cell transistors M in the selected memory block MB2 tunnel toward P well region 14; as a result, erasure is performed within the selected block only. During the block-erasing, data stored in those of the memory cell transistors in the non-selected blocks are kept non-erased, since the aforementioned tunneling of electrons does not occur therein.

The first important feature with the block-erase operation is to apply the erase voltage VppE to all select gates SG1, SG2 in memory cell array 16. It is true that the voltage potential at select gates SG does not affect the erase operation; however, if these select gates are at the ground potential, a high electric field is undesirably created in the insulation layer of the select gates, as a result of continuously applying the high voltage such as 20 volts to P type well region 14 during the block-erase operation. Applying erase voltage VppE to the select gates is significant in eliminating the creation of such a high, internal electric field.

The second important feature is that the transient potential difference at every part being applied with erase voltage VppE is forced to be lower than the external power supply voltage Vcc of EEPROM 10, thereby eliminating the occurrence of any accidental erase phenomenon, as will be described in detail later. The components to be applied with erase voltage VppE—such as select gates SG, the word lines of non-selected blocks, etc.—will be different in the potential varying rate from one another due to the difference in the parasitic capacitances or storage capacitances inherent therein, even when the exactly the same voltage is applied to these components. This means that the voltage potentials will be variable among these components at different rates during application of erase voltage VppE.

For example, P type well region 14 has a relatively greater capacitance. Assume that a voltage supply line is coupled to this well region at a peripheral portion thereof. In this case, while the potential rising is rapid at the peripheral well portion, that of the central portion of well region is rather slow. Such imbalance in potential variation inside well region 14 will cause the internal electric field of memory cell transistors positioned at the center of well region 14 to increase temporarily. The reason for this is as follows: Wiring lines such as the word lines are long, narrow, and thin metal lines, and the capacitance thereof is thus small. The potential rising can be made much more rapidly on these wiring lines, than at the central portion of well region 14. As a result, the potential difference between the control gate electrodes of cell transistors and well region 14 increases transiently. This may result in an erroneous or accidental erase phenomenon.

To attain the second feature, the present invention employs, as the erase voltage (VppE) supply lines, a plurality of wiring lines that are "branched" from a single voltage bootstrap or booster circuit of limited current capacity. These wiring lines are bundled together at one circuit node; they are forced to discharge together at a time.

The internal circuit arrangement of EEPROM 10, which is suitable for the execution of block-erase operations, is as follows. In FIG. 7 is shown a main part of the circuit configuration including the cell block selector 28 and word/select gate line driver 18 of FIG. 1, which is associated with one (MBi) of the NAND cell memory blocks MB shown in FIG. 6. The remaining parts of the circuit are similarly arranged, and the explanation thereof is omitted.

As shown in FIG. 7 the block selector circuit 28 includes a NAND gate circuit G1. NAND gate G1 receives a row decoder enable signal RDENB and an address bits ai, and generates a logical (NAND) output therebetween at the output thereof. The NAND gate output is supplied via an inverter I3 to a circuit node N1. When a memory block MBi with which the selector 28 is associated is selected, node N1 rises toward the "H" level. The voltage at node N1 is connected via a transfer gate 70 to the decoder circuit 18. Node N1 is also connected to decoder 18 through an inverter I2 and a transfer gate 72. Transfer gate 70 includes a PMOS transistor Qp3 and NMOS transistor Qn3, which are connected in parallel with each other. Similarly, transfer gate 72 includes parallel-connected PMOS transistor Qp4 and NMOS transistor Qn4. Transfer gates 70, 72 are arranged so that one of these gates turns on selectively in response to erase control voltages ERASE, $\overline{\text{ERASE}}$. The voltage at node N1 is thus given to node N2 of decoder circuit 18 via either one of transfer gates 70, 72.

More specifically, when EEPROM 10 is set in the block-erase mode, control signal ERASE is at the "H" level, causing transfer gate 72 to turn on. The voltage at node N1 is potentially inverted by inverter I2, and then transferred to node N2. The voltage potential at node N2 of decoder circuit 18 being associated with the selected memory block MBi falls at the "L" level.

The node N1 is connected via a third transfer gate 74 to the second select gate SG2 of the corresponding NAND cell memory block MBi. This transfer gate includes a PMOS transistor Qp9 and an NMOS transistor Qn11, which are parallel connected with each other as shown in FIG. 7. Transfer gate 74 selectively turns on or off in response to read control signals READ, $\overline{\text{READ}}$, which are supplied to the gate electrodes of transistors Qp9, Qn11.

Driver circuit 18 includes a common driver circuit 76, to which the erase voltage VppE is supplied by the generator 26 shown in FIG. 1. Common driver 76 supplies select gate lines SG1, SG2 and word lines WL1 to WL8 of NAND memory block MBi with a bootstrap voltage of +20 volts, for example, as the previously described erase voltage VppE. Common driver circuit 76 includes two PMOS transistors Qp1, Qp2 serving as current load elements, and NMOS transistors Qn1, Qn2 acting as current-driver devices. The voltage on node N2 is directly supplied to the gate electrode of one of the driver transistors, i.e., Qn1; the voltage is also supplied to the same of the other driver transistor Qn2 through an inverter I1. The complementary output is thus obtained at the outputs of circuit 76.

The output of either one of driver transistors Qn1, Qn2 (i.e., a drain output 78 of transistor Qn2) is at the "L" level with respect to the selected NAND memory block MBi in the block-erase mode; it is at the "H" level with respect to the other, non-selected blocks MB1, ..., MB(i−1), MB(i+1), ..., MBm. Output node 78 is connected to the control gate lines of selected block MBi, i.e., transfer gates 80-1, 80-2, ..., 80-8 that are provided at word lines WL1 to WL8 respectively. Each of these word-line transfer gates 80 includes a parallel circuit of one PMOS transistor and one NMOS transistor. Each parallel transistor circuit is provided with a discharging NMOS transistor Qn8, Qn14, ..., Qn10, or Qn16. Word-line transfer gates 80 receive at their inputs control signals CD1 to CD8. In response to the potential variation at output node 78, transfer gates 80 selectively turn on causing control signals CD to be applied to word lines WL. Word-line transfer gates 80 in the selected block MBi are maintained in the turn-off state. Control signals CD1 to CD8 may be the erase voltage VppE in the block-erase mode.

The other output of common driver circuit 76, i.e., a drain output 82 of driver transistor Qn1, is coupled to the gates of the above-mentioned discharging transistors. Output signal 82 will be given to these transistors as a switch-control signal.

Looking at the selected memory blocks MBi, the output of selector 28 or node N2 is at the "L" level. At this time, the first output of common driver circuit 76 is at the "H" level, and the second output thereof is at the "L" level. Word-line transfer gates 80-1, 80-2, ..., 80-7, 80-8 are thus forced to turn on. Discharging transistors Qn8, Qn10, Qn14, ..., Qn16 at these transfer gates turn on to discharge carriers. Word lines Wl1 to WL8 are then at zero volts.

Under such a situation, the first and second output voltages of common driver circuits each corresponding to driver 76 in the non-selected memory blocks MB1, ..., MB(i−1), MB(i+1), ..., MBm are potentially reverse to those of the above-mentioned case. More specifically, first output 78 of each common driver circuit (76) is at the "L" level; second output thereof is at the "H" level. The word line transfer gates turn on causing control signals CD1 to CD8 to be applied to all of word lines WL.

The driver circuit 18 of FIG. 1 further includes a select gate driver circuit 84 for controlling the potential level on the first select gate line SG1. Driver circuit 84 has a C2MOS inverter configuration, i.e., a series circuit of PMOS transistors Qp5, Qp6 and NMOS transistors Qn5, Qn6. A specific voltage VmSG is supplied to circuit 84 as its power supply voltage; voltage VmSG has an intermediate potential between the "H" level voltage and the "L" level voltage in a write mode, and, in other operation modes, holds the same potential level as that of the external power supply voltage Vcc of EEPROM 10. A P-side clock signal ERASEH is supplied to the gate electrode of PMOS transistor Qp5. Signal ERASEH is a voltage signal that is potentially the same in magnitude as the erase voltage VppE in an erase mode. A common node of transistors Qp6, Qn5 is connected to first select gate line SG1, while the gate electrodes thereof are connected to the gate electrodes of transistors Qp7, Qn8, ..., Qp8, Qn10 as shown in FIG. 7.

An NMOS transistor Qn12 is connected to the first select gate line SG1, and turns on and off in response to the control signal ERASEH supplied at the gate electrode thereof. The second select gate line SG2 is provided with a series circuit of NMOS transistors Qn17, Qn18, wherein signal ERASEH is supplied to the gate electrode of transistor Qn17. Both the first and second select gate lines SG1, SG2 are supplied with control signal VppSG, which becomes potentially equal to erase voltage VppE (=20 volts). With such an arrangement, NMOS transistors Qn12, Qn17 turn on in a block-erase mode, regardless of whether they are associated with selected memory block MBi or non-selected memory blocks MB1, MB2, ..., MB(i−1), MB(i+1), ..., MBm. As a result, first and second select gate lines SG1, SG2 are supplied with voltage VppSG of +20 volts.

Strictly discussing, the voltage to be applied to the first and second select gate lines SG1, SG2 in the block-erase mode is not identically the same as the control voltage VppSG itself; rather, it is a voltage corresponding to the difference between voltage VppSG and the threshold voltage Vth of NMOS transistor Qn12 or Qn17. At this time, P type well region 14, in which memory cell array 16 is arranged, and common source node 66 (see FIG. 2) of NAND cell units U are supplied with well control voltage Vwell, which is potentially equal to erase voltage VppE in the block-erase mode.

Figure 8:
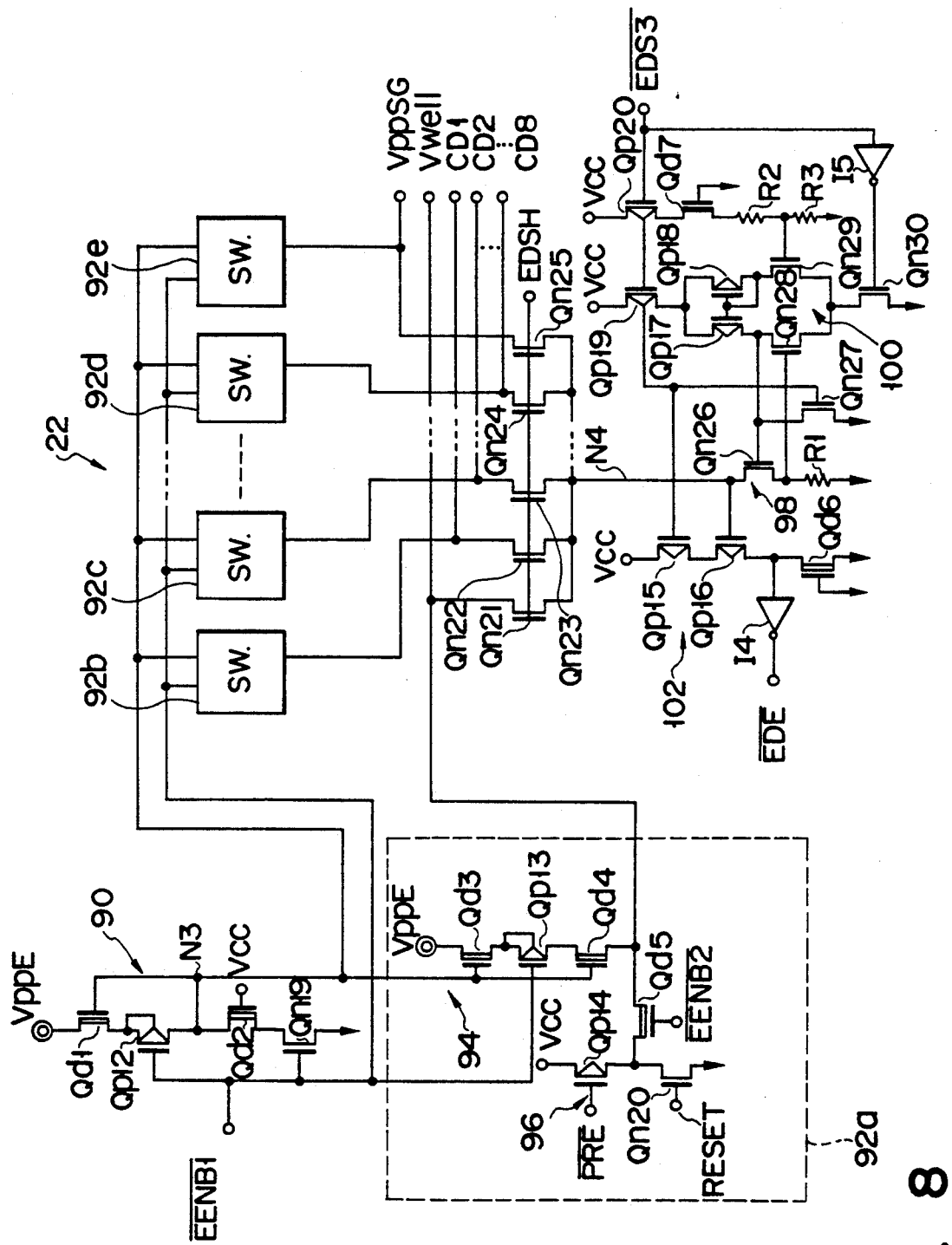
FIG. 8 is a circuit diagram showing an erase voltage controller shown in FIG. 1 which is associated with the memory cell array of FIG. 1.

FIG. 8 details the internal circuit configuration of the erase voltage controller circuit 22 of FIG. 1. Circuit 22 produces several kinds of voltage signal VppSG, Vwell, CD1 to CD8 shown in FIG. 7. An output circuit 90 is arranged to generate at its output erase voltage VppE, which is supplied by erase voltage generator 26 in response to an erase enable signal $\overline{\text{EENB1}}$. The output (erase voltage VppE) of circuit 90 is distributed by a plurality of switch circuits 90a, 90b, 90c, 90d, 90e in parallel to a number of signal transmission lines for control signals VppSG, Vwell, CD1, ..., CD8. Output circuit 90 includes an NMOS transistor Qn19 and a PMOS transistor Qp12; the former turns on and the latter turns off when erase-enable signal $\overline{\text{EENB1}}$ is at "H" level. When erase-enable signal EENB1 drops to "L" level, NMOS transistor Qn19 turns off, and then PMOS transistor Qp12 turns off causing erase voltage VppE to be transferred to a node N3 through a depression type (D-type) NMOS transistor Qd1 and the PMOS transistor Qp12. D-type NMOS transistors Qd1, Qd2 are added on the P-channel side and the N-channel side respectively, for restricting the flow of current through circuit 90.

In FIG. 8 one (92a) of switch circuits 92 includes a voltage booster circuit 94 and a Vcc-precharge circuit 96; the remaining ones are similarly arranged, and the internal configuration thereof is omitted for the sake of simplicity of illustration. Booster 94 consists of a series circuit of D-type NMOS transistors Qd3, Qd4, and a PMOS transistor Qp13; transistors Qd3, Qd4 are responsive to, the voltage potential at node N3, and transistor Qp13 is to erase-enable signal $\overline{\text{EENM1}}$.

During block-erasing, the series transistor circuit is applied with erase voltage VppE appearing at node N3, so that voltage VppE may be fed to the VppSG, Vwell, CD1, ..., CD8 signal lines without the occurrences of any potential drop. Precharge circuit 96 consists of a series circuit of a PMOS transistor Qp14 and an NMOS transistor Qn20, which are controlled by control signals $\overline{\text{PRE}}$, RESET, respectively. These signals fall at "L" level as soon as EEPROM 10 enters in an erase mode. PMOS transistor Qp14 turns on, while NMOS transistor Qn20 turns off. This causes the signal lines to be precharged up to the power supply voltage Vcc via a D-type transistor Qd5, which is responsive to a second erase-enable signal EENB2.

The VppSG, Vwell, CD1, ..., CD8 signal transmission lines differ in capacitance from one another; naturally, voltage difference tends to appear among these lines during potential rising thereon. As has been mentioned earlier, the voltage difference brings much risk of causing an erroneous or accidental data erase operation. This risk may be overcome by forcing the voltage difference at any one of the signal lines to be lower than the power supply voltage Vcc. This can be done by employing the output voltage of a single circuit (26) for producing erase voltage VppE, which circuit is relatively small in current-capacity so that voltage boosting or bootstrap is performed slowly.

Very importantly, the VppSG, Vwell, CD1, ..., CD8 lines are bundled together at a circuit node N4, with a corresponding number of NMOS transistors Qn21, Qn22, Qn23, Qn24, Qn25 being associated with the lines respectively. Transistors Qn21 to Qn25 are controlled by a control signal EDSH, which will rise toward "H" level at the end of the erase mode. Node N4 is coupled to a discharge circuit 98 consisting of an NMOS transistor Qn26 and a resistor R1. Accordingly, the signal lines bundled may discharge together through one discharging path arranged at node N4 as the erase voltage rises.

The gate electrode of discharging NMO transistor Qn26 is potentially controlled by a current-mirror type CMOS differential amplifier circuit 100. This amplifier includes PMOS transistors Qp17, Qp18 acting as an active load, NMOS transistors Qn28, Qn29, an activation PMOS transistor Qp19 controlled by a control signal $\overline{EDS3}$, and a power source NMOS transistor Qn30 that is activated in response to the inverted signal of control signal $\overline{EDS3}$. An inverter I5 does this job, i.e., inverting signal $\overline{EDS3}$. A series circuit of enhancement type (E-type) PMOS transistor Qd20, a D-type NMOS transistor Qd7, and resistors R2, R3 is arranged to produce a reference voltage for CMOS differential amplifier 100.

The node N4 is provided with a voltage detecting circuit 102, which may consist of a series circuit of an activation PMOS transistor Qp15 operating in response to a control signal EDS3, a PMOS transistor Qp16 having its gate connected to node N4, and a D-type NMOS transistor Qd6 having its gate grounded. When the voltage at node N4 decreases down to a specific potential level of Vcc−|Vthp| (Vthp is the threshold voltage of PMOS transistor Qn16), detection transistor Qp16 turns on so that the drain potential of NMOS transistor Qd6 rises. The resultant voltage is inverted by an inverter I4 to obtain an erase termination signal $\overline{EDE}$.

The VppSG, Vwell, CD1, . . . , CD8 lines having the potentially increased (boosted) voltage at the beginning of erase mode are forced to discharge together at a time, since they are bundled together at node N4 as mentioned previously. Therefore, both the potential rising and dropping on these lines may be performed slowly, thereby to enable the potential difference on each line to be held below the external power supply voltage Vcc.

The detailed configuration of the substrate voltage controller 24 of FIG. 1 is illustrated in FIG. 9, which is essentially similar to the previously described "boosted voltage supply circuit" that consists of output circuit 90 and switch circuits 92 of FIG. 8. The erase-enable signal $\overline{EENB2}$ is at "H" level in all the operation modes but an erase mode. A D-type NMOS transistor Qd10 is rendered conductive at this time, so that the substrate is supplied with the power supply voltage Vcc. When erase-enable signal $\overline{EENB2}$ changes to have "L" level, an NMOS transistor Qn31 turns off, while PMOS transistors SQp21, Qp22 turn on. This causes erase voltage VppE to be supplied to the substrate.

FIG. 10 shows a circuit to supply an erase control signal ERASEH, which is preferably used in the FIG. 7 circuit. The circuit of FIG. 10 is similar to that shown in FIG. 9; it differs from it only in that a precharge circuit is added which is controlled by control signals $\overline{PRE}$, RESET. The additional circuit is required in order to meet the following requirements: The ERASEH line must remain at zero volts, whereas substrate 12 should be constantly applied with the external power supply voltage Vcc. NMOS transistor Qn34 is rendered conductive by control signal RESET having "H" level in all the operation modes other than the erase mode; the ERASEH line is thus at zero volts. A precharge operation begins when control signals RESET, $\overline{PRE}$ are at "L" level in the erase mode.

FIG. 11 shows a circuit configuration employed to produce the gate control signal EDSH for causing the signal lines to discharge together at discharging node N4. Not so large current-drivability is required for this control signal, since it merely controls a limited number of—ten, in this embodiment—MOS transistors. Accordingly, the FIG. 11 circuit may be comprised of only the pre-stage section of the circuit shown in FIG. 8 or 10. After the completion of an erase operation, a control signal $\overline{EDS1}$ changes at "L" level causing an NMOS transistor Qn35 to turn off. A control signal $\overline{EDS2}$ is then at "L" level, rendering a PMOS transistor Qp26 conductive. Control signal EDSH thus becomes potentially equal to erase voltage VppE. The transfer gates Qn21, Qn22, . . . of FIG. 8 turn on in response to control signal EDSH. Discharge circuit 98 is activated when control signal $\overline{EDS3}$ is at "L" level.

The block-erase operation of the NAND cell type EEPROM 10 is as follows. In FIG. 12 a time period t1–t2 is an erase execution period, and a period t3–t4 is a discharge period.

As shown in FIG. 12 the erase control signal ERASE is first ramped positively toward "H" level, causing an erase operation to begin. A row decoder enable signal RDENB is at "H" level; a certain memory block is selected for erasure among memory blocks MB in accordance with the logic sum of it and an input address ai. Then, control signals $\overline{PRE}$, RESET are at "L" level causing the VppSG, Vwell, CD1-CD8, ERASEH lines to be precharged to the power supply voltage Vcc. Signal $\overline{PRE}$ recovers at "H" level, and erase enable signals $\overline{EENB1}$, $\overline{EENB2}$ are at "L" level. As a result, all the select gate lines, the control gate lines of nonselected memory blocks, well voltage Vwell, and substrate voltage Vsub are forced to rise toward erase voltage VppE.

After a predetermined time period has elapsed, erase-enable control signal $\overline{EENB1}$ is at "H" level, rendering common output circuit 90 inoperative, whereby each switch circuit 92 is electrically disconnected from booster circuit 26 of FIG. 1. When control signal $\overline{EDS1}$ is at "L" level, signal EDS2 has "L" level. Control signal EDSHH becomes equal in potential to eras voltage VppE. The VppSG, Vwell, CD1-CD8 lines begin to discharge together via discharge circuit 98. The discharging potential level approaches the Vcc-|Vthp| level.

When the discharging voltage is potentially equal to the above level, a discharge-termination signal $\overline{EDE}$ appears to be "L" level. With a certain length of time period, enable signal $\overline{EENB2}$ rises at "H" level, and control signal RESET is then at "H" level. All the circuit nodes concerned are thus reset to their initial condition that is before the erase mode. The erase operation is now terminated. Note in FIG. 12 that the indication Vswout represents a pulsing waveform of the output voltage of switch circuits 92 shown in FIG. 8. Also note that a read-write voltage VppRW of FIG. 12, which is applied to circuit 76 of FIG. 7, is a voltage signal which is potentially equal to erase voltage VppE, and is equal to write voltage VppW during programming.

With the block-erase technique in accordance with the invention, any desired one of memory blocks MB can be individually selected for erasure successfully. During the block erasing, the erase voltage VppE is applied to all the select gate lines SG, so that the potential stress can be lightened at the select gate section of each memory block. This may lead to high operating reliability. The erase operation reliability can be further improved by eliminating any accidental erasure by decelerating either the potential rising rate at every part of internal elements to which the erase voltage is applied during the erase operation, or the discharging rate at the same after the erase operation, thereby to force any possible potential variation to be maintained within a narrow allowable range.

The present invention is not limited to the above-described specific embodiments and may be practiced or embodied in still other ways without departing from the spirit or essential character thereof.

What is claimed is:

1. An electrically erasable and programmable semiconductor memory device comprising:
   a semiconductive substrate having a well region;
   an array of rows and columns of memory cells in said well region, said array being divided into a plurality of memory blocks, each of said memory cells including a memory cell transistor with a carrier storage layer and a control gate;
   program lines associated with the rows of memory cells in each of said memory blocks;
   data transfer lines associated with the columns of memory cells in each memory block;
   erase means for causing a selected one of said memory blocks to be submitted to an erase operation while causing the remaining ones of said memory blocks to be maintained as non-selected memory blocks; and
   potential variation eliminator means for, while said selected memory block is being subjected to the erase operation, causing potential variations on the program lines associated with the memory cell transistors in said non-selected memory blocks, and said well region to be smaller in magnitude than a power supply voltage to be externally supplied to said memory device.

2. A device according to claim 1, wherein said erase means comprises:
   voltage application means for selectively applying a suitable voltage potential to the control gates of the memory cell transistors in the selected memory block so that carriers are permitted to move to or from the carrier storage layers thereof, while causing an internal electric field of the memory cell transistors in the non-selected memory blocks to be weak enough to prevent movement of carriers therein.

3. A device according to claim 2, wherein said voltage application means applies a ground potential to said control gates of the memory cell transistors in said selected memory block, while applying a preselected potential to said well region and the control gates of the memory cell transistors in said non-selected memory blocks so that potential difference between said well region and the carrier storage layers in said nonselected memory blocks is substantially zero.

4. A device according to claim 3, wherein said memory cell transistors in each of said memory blocks are arranged in a plurality of series circuits of memory cell transistors, with which said data transfer lines are associated respectively.

5. A device according to claim 4, further comprising:
   switching transistor means arranged in said series circuits of memory cell transistors, for selectively turning on causing one of said series circuits to be connected with a corresponding data transfer line associated therewith, said switching transistor means having a control gate;
   a control line connected to said control gate; and
   said voltage application means applying said control line with said preselected potential during application of the same to said well region and said control gates of the memory cell transistors in said nonselected memory blocks.

6. A device according to claim 5, wherein said potential variation eliminator means causes potential variations on said control line of each of the selected and non-selected memory blocks to be smaller in magnitude than the power supply voltage of said memory device.

7. A device according to claim 6, wherein said potential variation eliminator means comprises:
   common voltage generator means for generating a voltage of said preselected potential which is supplied in common to said program lines in said non-selected memory blocks, said control line in each of the selected and non-selected memory blocks, and said well region.

8. A device according to claim 6, wherein said potential variation eliminator means comprises:
   discharge controller means for causing said program lines in said non-selected memory blocks, said control line in each of the selected and non-selected memory blocks, and said well region to discharge substantially simultaneously at the end of the erase operation.

9. A device according to claim 7, wherein said common voltage generator means includes a voltage booster circuit for producing a bootstrap voltage that is potentially greater in magnitude than said power supply voltage as said voltage of said preselected potential.

10. An electrically erasable and programmable read-only memory comprising:
    a semiconductive substrate of a selected conductivity type;
    a semiconductive well region arranged in said substrate and having an opposite conductivity type;
    a plurality of memory blocks arranged in said well region, each of which includes a plurality of series arrays of floating gate tunneling field effect transistors each of which has a floating gate and a control gate to serve as a memory cell, wherein binary information may be selectively stored in a selected memory cell transistor by causing electrical carriers to tunnel between the floating gate thereof and said well region;
    switching transistors connected to first ends of the series arrays of memory cell transistors, and each having a control gate;
    first control lines connected to the control gates of said memory cell transistors;
    second control lines connected to the control gates of said switching transistors;
    data lines associated with said series array of memory cell transistors such that each array is selectively connected to a data line via a corresponding one of said switching transistors;
    block-erase means for performing an erase operation with respect to a selected memory block while forcing the remaining, non-selected memory blocks to remain non-erased, by applying a first voltage to those of said first control lines associated with the selected memory block, and a second voltage to the remaining ones of said first control lines, said second control lines and said well region; and said block-erase means comprising a common voltage source means for generating a d.c. voltage that is potentially greater in magnitude than an external power supply voltage of said memory, and for supplying said d.c. voltage as said second voltage in common to said remaining ones of said first control lines, said second control lines and said well region.

11. A memory according to claim 10, wherein said block-erase means further comprises:

potential variation eliminator means for causing a possible potential variation at said remaining ones of said first control lines, said second control lines, and said well region to be less than said external power supply voltage.

12. A memory according to claim 11, wherein said potential variation eliminator means includes:

discharge accelerator means for forcing said remaining ones of said first control lines, said second control lines, and said well region to discharge substantially simultaneously at a common discharge node.

13. A memory according to claim 12, wherein said block-erase means causes said data lines to be in an electrically floating condition.

14. A memory according to claim 13, wherein said series array of memory cell transistors constitutes NAND cell units in each of said memory blocks.

15. A memory according to claim 14, further comprising:

additional switching transistors which have control gates and are connected to second ends of said series arrays of memory cell transistors, for selectively connecting said series arrays to said well region;

third control lines connected to the control gates of said further switching transistors; and said block-erase means providing said third control lines with said second voltage.

16. A memory according to claim 15, wherein said discharge accelerator means forces said third control lines to discharge substantially simultaneously at said common discharge node when said remaining ones of said first control lines, said second control lines, and said well region discharge together.

17. An electrically erasable and programmable non-volatile semiconductor memory device comprising:

a semiconductive layer;

an array of memory cells in said semiconductive layer, each of said memory cells including a transistor having a charge storage layer and a control gate insulatively stacked above said semiconductive layer;

erase means for selectively erasing said memory cells, said erase means for erasing a presently selected memory cell by charging said semiconductive layer so that this layer is at a first predetermined voltage, by causing the charge storage layer of the selected memory cell to vary due to a potential difference between the control gate of said selected memory cell and said semiconductive layer;

said erase means forcing a potential difference between the control gate of a non-selected memory cell and said semiconductive layer to be small enough to cause the non-selected memory cell to remain substantially non-erased during an erase operation of said selected memory cell; and said erase means including potential variation suppression means for, when said semiconductive layer charges and discharges during the erase operation, controlling potential variations between said semiconductive layer and the non-selected control gate so as to be smaller in magnitude than a second predetermined voltage which is less in potential than the first voltage.

18. A device according to claim 17, wherein said potential variation suppression means causes said non-selected control gate to be substantially at said first voltage, causing a potential difference between said semiconductive layer and said non-selected control gate to be substantially zero.

19. A device according to claim 18, wherein said potential variation suppression means includes:

voltage-supply wiring line means connected through a first node to said semiconductive layer and said non-selected control gate, for supplying them with said first voltage through said first node; and a voltage generator circuit connected to said voltage supply wiring means, for generating said first voltage.

20. A device according to claim 18, wherein said potential variation suppression means includes:

discharge means connected through a second node to said semiconductive layer and said non-selected control gate, for causing said layer and said non-selected control gate to discharge substantially simultaneously through said second node at a termination of the erase operation.

21. A device according to claim 19, wherein said potential variation suppression means includes:

discharge means connected through a second node to said semiconductive layer and said non-selected control gate, for causing said layer and said non-selected control gate to discharge substantially simultaneously through said second node at a termination of the erase operation.

22. A device according to claim 18, wherein the second voltage is equivalent in potential to a power supply voltage externally supplied to said device.

23. A device according to claim 18, wherein said semiconductive layer includes a well region of a chosen conductivity type being formed in a substrate of said device.

24. A device according to claim 18, wherein said transistor has an impurity-doped semiconductor layer which is formed in said semiconductive layer and is opposite in conductivity type to said semiconductive layer and wherein said erase means causes the impurity-doped layer of said non-selected memory cell to be electrically floating during the erase operation.

25. A device according to claim 18, wherein said transistor has an impurity-doped semiconductor layer which is formed in said semiconductive layer and is opposite in conductivity type to said semiconductive layers, and wherein said erase means allows the impurity-doped layer of said non-selected memory cell to vary in potential to approach said first voltage during the erase operation.

26. A device according to claim 18, further comprising:

word lines connected to the control gates of said memory cells;

bit lines associated with said array of memory cells;

switching transistors connected between said bit lines and said array of memory cells, and each having a control gate; and said erase means causes the control gates of said switching transistors to be substantially equivalent to said first voltage during the erase operation.

27. A device according to claim 26, wherein each of said switching transistors has an impurity-doped semiconductor layer which is formed in said semiconductive layer and is opposite in conductivity type to said semiconductive layer, and wherein said erase means causes said impurity-doped layer to be electrically floating during the erase operation.

28. A device according to claim 26, wherein each of said switching transistors has an impurity-doped semiconductor layer which is formed in said semiconductive layer and is opposite in conductivity type to said semiconductive layer, and wherein said erase means allows said impurity doped layer to potentially vary to approach said first voltage during the erase operation.

29. A device according to claim 18, wherein said memory cells are subdivided into a plurality of sections each including a preselected number of memory cell transistors connected in series with one another.

30. A device according to claim 29, further comprising:

word lines connected to the control gates of said memory cell transistors;

bit lines associated with said sections;

switching transistors connected between said bit lines and said sections, and each having a control gate; and said erase means causes the control gates of said switching transistors to be substantially equivalent to said first voltage during the erase operation.

31. A device according to claim 30, wherein each of said switching transistors has an impurity-doped semiconductor layer which is formed in said semiconductive layer and is opposite in conductivity type to said semiconductive layer, and wherein said erase means causes said impurity-doped layer to be electrically floating during the erase operation.

32. A device according to claim 30, wherein each of said switching transistors has an impurity-doped semiconductor layer which is formed in said semiconductive layer and is opposite in conductivity type to said semiconductive layer, and wherein said erase means allows said impurity-doped layer to potentially vary to approach said first voltage during the erase operation.

33. A device according to claim 18, wherein said memory cells include a plurality of blocks each including rows and columns of memory cell transistors being subdivided into a preselected number of memory cell transistors connected in series with one another.

34. A device according to claim 33, wherein said erase means causes a selected one of said blocks to be subjected to an erase operation, while causing the remaining ones of said blocks to be kept unchanged in data storage condition, and wherein said erase means potentially controls the control dates of the memory cell transistors in a selected block so that carriers are permitted to move to or from their charge storage layer, and causes the control gates of the memory cell transistors of the remaining, non-selected blocks to maintain substantially at said first voltage.

35. A device according to claim 34, wherein further comprising:

word lines connected to the control gates of said memory cell transistors;

bit lines associated with said sections in each block;

switching transistors connected between said bit lines and said sections, and each having a control gate; and said erase means forces the control gates of said switching transistors in all the blocks to be substantially equivalent to said first voltage during the erase operation.

36. A device according to claim 35, wherein each of switching transistors has an impurity-doped semiconductor layer which is formed in said semiconductive layer and is opposite in conductivity type to said semiconductive layer, and wherein said erase means causes the impurity-doped layer of each switching transistor in said non-selected blocks to be electrically floating during the erase operation.

37. A device according to claim 35, wherein each of said switching transistors has an impurity-doped semiconductor layer which is formed in said semiconductive layer and is opposite in conductivity type thereto, and wherein said erase means allow to impurity-doped layer of each switching transistor in said non-selected blocks to potentially vary to approach said first voltage during the erase operation.

* * * * *